(12) United States Patent
Rao et al.

(10) Patent No.: US 10,411,187 B2
(45) Date of Patent: Sep. 10, 2019

(54) PHASE CHANGE MATERIAL FOR PHASE CHANGE MEMORY AND PREPARATION METHOD THEREFOR

(71) Applicant: SHANGHAI INSTITUTE OF MICROSYSTEM AND INFORMATION TECHNOLOGY, CHINESE ACADEMY OF SCIENCES, Shanghai (CN)

(72) Inventors: Feng Rao, Shanghai (CN); Zhitang Song, Shanghai (CN); Keyuan Ding, Shanghai (CN); Yong Wang, Shanghai (CN)

(73) Assignee: SHANGHAI INSTITUTE OF MICROSYSTEM AND INFORMATION TECHNOLOGY, CHINESE ACADEMY OF SCIENCE, Changning District, Shanghai (CN)

( * ) Notice: Subject to any disclaimer, the term of this patent is extended or adjusted under 35 U.S.C. 154(b) by 0 days.

(21) Appl. No.: 15/739,858

(22) PCT Filed: Aug. 23, 2016

(86) PCT No.: PCT/CN2016/096334
§ 371 (c)(1),
(2) Date: Jun. 22, 2018

(87) PCT Pub. No.: WO2017/067314
PCT Pub. Date: Apr. 27, 2017

(65) Prior Publication Data
US 2018/0315921 A1  Nov. 1, 2018

(30) Foreign Application Priority Data

Oct. 23, 2015 (CN) .......................... 2015 1 0697470

(51) Int. Cl.
*H01L 45/00* (2006.01)
*G11C 13/00* (2006.01)

(52) U.S. Cl.
CPC ............ *H01L 45/144* (2013.01); *H01L 45/06* (2013.01); *H01L 45/1616* (2013.01); *H01L 45/1625* (2013.01); *G11C 13/0004* (2013.01)

(58) Field of Classification Search
CPC ......... H01L 27/24; H01L 45/00; H01L 45/06; H01L 45/144; H01L 45/1616; H01L 45/1625

See application file for complete search history.

(56) References Cited

U.S. PATENT DOCUMENTS

| | | | | |
|---|---|---|---|---|
| 7,829,876 B2 * | 11/2010 | Lung | ....................... | H01L 45/06 257/2 |
| 2002/0146643 A1 * | 10/2002 | Shingai | .................. | G11B 7/243 430/270.13 |

(Continued)

OTHER PUBLICATIONS

Skelton et al. In silico optimization of phase-change materials for digital memories: a survey of first-row transition-metal dopants for Ge2Sb2Te5, Apr. 30, 2013, Journal of Physics: Condensed Matter, vol. 25 (2013) 205801, pp. 1-10.*

*Primary Examiner* — Allan R Wilson
(74) *Attorney, Agent, or Firm* — Global IP Services; Tianhua Gu

(57) ABSTRACT

A phase change material for a phase change memory and a preparing method thereof. The phase change material for a phase change memory has a chemical formula of $Sc_{100-x-y-z}Ge_xSb_yTe_z$, wherein $0 \leq x \leq 60$, $0 \leq y \leq 90$, $0 < z \leq 65$, $0 < 100-x-y-z < 100$. The phase change material for a phase change memory according to the present invention is capable of repeatedly changing phases. The $Sc_{100-x-y-z}Ge_xSb_yTe_z$ has two different resistance value states, i.e., a high resistance state and a low resistance state, and a reversible transfor- (Continued)

mation between the high resistance state and the low resistance state can be achieved by being applied a pulse electrical signal thereto, which satisfies basic requirements of a storage material for the phase change memory.

10 Claims, 2 Drawing Sheets

(56) References Cited

U.S. PATENT DOCUMENTS

| | | | |
|---|---|---|---|
| 2004/0126623 A1* | 7/2004 | Shirai | G11B 7/00454 |
| | | | 428/64.4 |
| 2006/0044991 A1* | 3/2006 | Nishihara | G11B 7/24038 |
| | | | 369/272.1 |
| 2006/0141202 A1* | 6/2006 | Suenaga | G11B 7/243 |
| | | | 428/64.1 |
| 2012/0051124 A1* | 3/2012 | Tang | H01L 27/2409 |
| | | | 365/163 |

* cited by examiner

PHASE CHANGE MATERIAL FOR PHASE CHANGE MEMORY AND PREPARATION METHOD THEREFOR

CROSS REFERENCE TO RELATED PATENT APPLICATION

The present application is the US national stage of PCT/CN2016/096334 filed on Aug. 23, 2016, which claims the priority of the Chinese patent application No. CN201510697470.2 filed on Oct. 23, 2015, which application is incorporated herein by reference.

TECHNICAL FIELD

The present invention relates to technical field of microelectronics, and more particularly to a phase change material $Sc_{100-x-y-z}Ge_xSb_yTe_z$ for a phase change memory and a preparing method thereof.

BACKGROUND

The development of information storage technology is an embodiment of the progress of human civilization. From the invention of transistors to the advent of integrated circuits, human usher in a glorious era of information. The rapid development of information technology drives storage technology to rapidly develop towards non-volatile, high speed, low operation power consumption and good cycling performance. As a mainstream non-volatile storage technology used at present, flash memory has been widely used. However, with the rapid development of integrated circuits, disadvantages, such as limited number of cycles, slow operating speed and high operating voltage, of the flash memory limit its further application. Therefore, searching for a new generation of non-volatile memory has become the only way to improve information technology.

Due to the advantages, such as high-speed reading, high times of cycle, non-volatile, small component size, low power consumption, strong vibration resistance and radiation resistance, phase change memory is regarded by the International Semiconductor Industry Association as the most likely substitute for the present flash memory to become a device that will be the mainstream of future memory products and the first to become a commercial product.

The basic principle of a phase change memory is using the reversible transformation between high resistance (amorphous state) and low resistance (crystalline state) of a memory material in a device to achieve storage of "1" and "0." Multi-level storage can be realized by using electrical signals to control the continuous changes of the high resistance of a memory material, such that the information storage capacity of a memory can be greatly improved.

Common phase change memory material system is tellurium-based material, such as Ge—Sb—Te, Si—Sb—Te, Ag—In—Sb—Te. In particular, GST (Ge—Sb—Te) has been widely used in phase change optical disks and phase change memories. But following problems exist as well: 1, the crystallization temperature is low; the crosstalk problem between adjacent cells in the chip display is serious, which may result in the risk of data loss and restrict its application; 2, the thermal stability thereof is not good, and data retention cannot be guaranteed; 3, the speed of phase change needs to be further improved; studies have shown that the electrical pulse to achieve a stable RESET operation based on the GST-based phase change memory is at least 500 nanoseconds, which does not meet the speed requirements of dynamic random access memory. Storage material with a faster phase change speed is therefore required.

Thus, how to provide a phase change material having a better thermal stability, a faster phase change speed and a smaller operating current, and being beneficial for increasing the cycle operating life of a phase change memory based on the material is a problem to be solved by current technical field.

SUMMARY

In view of the disadvantages of the prior art described above, an object of the present invention is to provide a phase change material for a phase change memory and a preparing method thereof, for solving problems of low crystallization temperature, low thermal stability, bad data retention and slow phase change speed of the phase change materials in the prior art.

To achieve the above object and other related objects, the present invention provides a phase change material for a phase change memory having a chemical formula of $Sc_{100-x-y-z}Ge_xSb_yTe_z$, wherein $0 \leq x \leq 60$, $0 \leq y \leq 90$, $0 < z \leq 65$, $0 < 100-x-y-z < 100$.

As a preferred embodiment of the phase change material for a phase change memory according to the present invention, in the $Sc_{100-x-y-z}Ge_xSb_yTe_z$, $x=0$ and $0 < y \leq 80$.

As a preferred embodiment of the phase change material for a phase change memory according to the present invention, in the $Sc_{100-x-y-z}Ge_xSb_yTe_z$, $0 < x \leq 50$ and $y=0$.

As a preferred embodiment of the phase change material for a phase change memory according to the present invention, in the $Sc_{100-x-y-z}Ge_xSb_yTe_z$, $0 < x \leq 50$ and $0 < y \leq 80$.

As a preferred embodiment of the phase change material for a phase change memory according to the present invention, in the $Sc_{100-x-y-z}Ge_xSb_yTe_z$, $x=y=0$.

As a preferred embodiment of the phase change material for a phase change memory according to the present invention, the phase change material for a phase change memory comprises a high resistance state and a low resistance state; the high resistance state corresponds to an amorphous state of the phase change material for the phase change memory, and the low resistance state corresponds to a full or a partial crystalline state of the phase change material for the phase change memory.

As a preferred embodiment of the phase change material for a phase change memory according to the present invention, driven by electricity, laser pulse or electron beam, the resistivity of the phase change material for a phase change memory can be transformed reversibly.

The present invention further provides a method of preparing the phase change material for a phase change memory according to any one of the above. The method of preparing the phase change material for a phase change memory comprises preparing the phase change material for a phase change memory by using magnetron sputtering, chemical vapor deposition, atomic layer deposition, pulsed laser deposition, electron beam evaporation or electroplating according to different proportions of Sc, Ge, Sb and Te in the chemical formula of $Sc_{100-x-y-z}Ge_xSb_yTe_z$.

As a preferred embodiment of the method of preparing the phase change material for a phase change memory according to the present invention, the method of preparing the phase change material for the phase change memory comprises obtaining a needed phase change material for a phase change memory by co-sputtering Sc simple substance target and $Sb_2Te_3$ alloy target, Sc simple substance target and $Sb_2Te$ alloy target, or Sc simple substance target and Sb simple substance target as well as Te alloy target, wherein the Sc simple substance target uses a direct-current power source, and the $Sb_2Te_3$ alloy target, the $Sb_2Te$ alloy target, the Sb simple substance target and the Te simple substance target use radio-frequency power sources.

As a preferred embodiment of the method of preparing the phase change material for a phase change memory according to the present invention, the method of preparing the phase change material for the phase change memory comprises obtaining a needed phase change material for a phase change memory by co-sputtering $Sb_2Te_3$ alloy target and $Sc_2Te_3$ alloy target in argon atmosphere, wherein the $Sb_2Te_3$ alloy target uses a radio-frequency power source, and the $Sc_2Te_3$ alloy target uses a radio-frequency power source.

As a preferred embodiment of the method of preparing the phase change material for a phase change memory according to the present invention, the method of preparing the phase change material for a phase change memory comprises obtaining a needed phase change material for a phase change memory by co-sputtering $Sc_2Te_3$ alloy target and $Ge_2Sb_2Te_5$ alloy target, or Sc simple substance target and Ge simple substance target as well as Sb simple substance target and Te simple substance target in argon atmosphere, wherein the Sc simple substance target uses a direct-current power source, and the $Sc_2Te_3$ alloy Target, the $Ge_2Sb_2Te_5$ alloy target, the Ge simple substance target, the Sb simple substance target and the Te simple substance target use radio-frequency power sources.

As a preferred embodiment of the method of preparing the phase change material for a phase change memory according to the present invention, the method of preparing the phase change material for a phase change memory comprises obtaining a needed phase change material for a phase change memory by co-sputtering the Sc simple substance target, the Ge simple substance target and the Te simple substance target in argon atmosphere, wherein the Sc simple substance target uses a direct-current power source, the Ge simple substance target uses a radio-frequency power source, and the Te simple substance target uses a radio-frequency power source.

As a preferred embodiment of the method of preparing the phase change material for a phase change memory of the present invention, the method of preparing the phase change material for a phase change memory comprises obtaining the needed phase change material for a phase change memory by co-sputtering the Sc simple substance target and the Te simple substance target in argon atmosphere, wherein the Sc simple substance target uses a direct-current power source, and the Te simple substance target uses a radio-frequency power source.

As described above, the phase change material $Sc_{100-x-y-z}Ge_xSb_yTe_z$ for a phase change memory and the preparing method thereof according to the present invention have the following beneficial effects: the phase change material for a phase change memory provided by the present invention is capable of changing phases repeatedly; the $Sc_{100-x-y-z}Ge_xSb_yTe_z$ has two different resistance value states, i.e., a high resistance state and a low resistance state; and a reversible transformation between the high resistance state and the low resistance state can be achieved by exerting a pulse electrical signal thereto, which satisfies basic requirements of a storage material for the phase change memory. The phase change material for a phase change memory according to the present invention is a novel storage material, and the thermal stability, the phase change speed and the fatigue-circulation performance of the material are therefore improved. A pulse voltage or a pulse laser can be used to drive the phase change material to be transformed reversibly among different structure states, and the performance of the phase change material is transformed reversibly at the same time, such that information storage of the phase change memory is achieved.

DETAILED DESCRIPTION OF THE PREFERRED EMBODIMENTS

The implementation modes of the present invention will be described below through specific examples. One skilled in the art can easily understand other advantages and effects of the present invention according to the content disclosed in the description. The present invention may also be implemented or applied through other different specific implementation modes. Various modifications or variations may be made to all details in the description based on different points of view and applications without departing from the spirit of the present invention.

Figure 1:
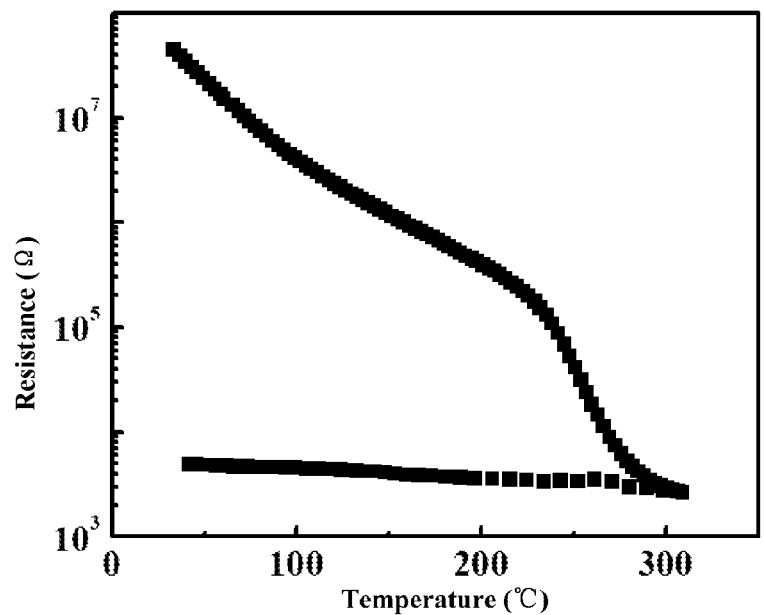
FIG. 1 shows a variation tendency of the resistance logarithm of the $Sc_{100-x-y-z}Ge_xSb_yTe_z$ phase change film material for phase change memory varied with the temperature according to the present invention.
Figure 2:
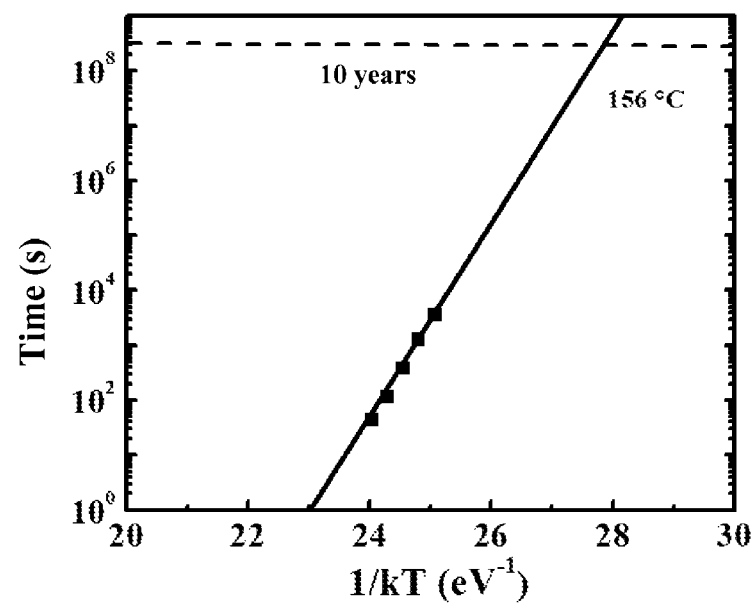
FIG. 2 shows a fitting curve of the data retentivity of the $Sc_{100-x-y-z}Ge_xSb_yTe_z$ phase change film material for phase change memory according to the present invention.
Figure 3:
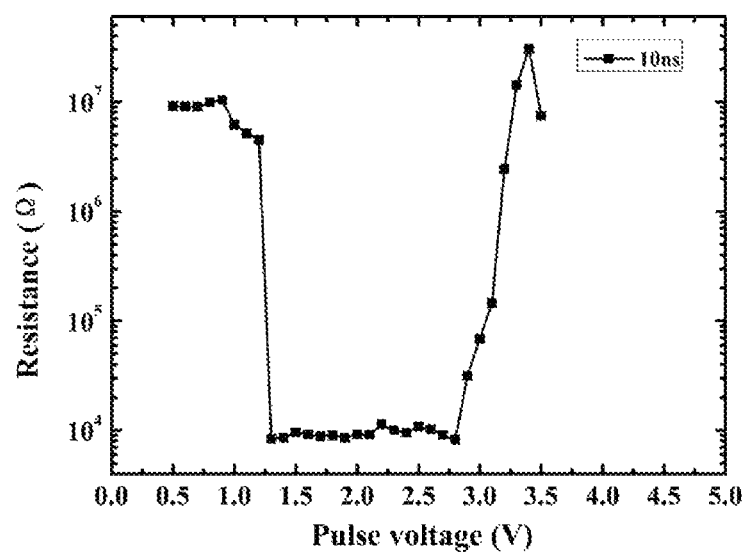
FIG. 3 shows the relationship between the resistance of the unit in the device and the applied voltage pulse in $Sc_{100-x-y-z}Ge_xSb_yTe_z$ phase change film material for phase change memory according to the present invention, wherein a pulse width is 10 ns.

Please refer to FIG. 1 to FIG. 3. It needs to be stated that the drawings provided in the following embodiments are used just for schematically describing the basic concept of the present invention. Although the drawings merely illustrate components that are related to the present invention, rather than being drawn according to the numbers, shapes and sizes of components during actual implementation, the configuration, number and scale of each component during actual implementation thereof may be freely changed, and the component layout configuration thereof may be more complex.

The present invention provides a phase change material for a phase change memory having a chemical formula of $Sc_{100-x-y-z}Ge_xSb_yTe_z$, wherein $0 \leq x \leq 60$, $0 \leq y \leq 90$, $0 < z \leq 65$, $0 < 100-x-y-z < 100$. The phase change material for a phase change memory can be obtained by using methods such as magnetron sputtering, chemical vapor deposition, atomic layer deposition, pulsed laser deposition, electron beam evaporation or electroplating.

As an example, the phase change material for the phase change memory comprises a high resistance state and a low resistance state, and the resistance value of the phase change material for the phase change memory in the high resistance state is 100 times as that in the low resistance state. The high resistance state corresponds to an amorphous state of the phase change material for the phase change memory, and the low resistance state corresponds to a full or a partial crystalline state of the phase change material for the phase change memory.

As an example, driven by electricity, laser pulse or electron beam, the resistivity of the phase change material for the phase change memory can be transformed reversibly.

In order to facilitate understanding of the technical solutions of the present invention, the specific embodiments are described in detail as follows.

Embodiment 1

The present embodiment provides a $Sc_{100-x-y-z}Ge_xSb_yTe_z$ phase change material system for a phase change memory, wherein the phase change material system is made by $Sb_2Te_3$ phase change material system doping with Sc, a chemical formula is $Sc_{100-x-y-z}Ge_xSb_yTe_z$, wherein x=0, 0<y≤80.

Driven by electricity, laser pulse or electron beam, the phase of the phase change material can be transformed reversibly to realize a function of data storage.

Specifically, in this embodiment, the $Sc_{100-x-y-z}Ge_xSb_yTe_z$ phase change material has a chemical formula of $Sc_5Sb_{38}Te_{57}$, and the $Sc_5Sb_{38}Te_{57}$ thin film is obtained by co-sputtering the $Sb_2Te_3$ alloy target and the Sc simple substance target. Different thickness of the material can be obtained by controlling the sputtering time. In this embodiment, the sputtering is carried out in argon atmosphere of 99.999%, and $Sb_2Te_3$ alloy target uses a radio-frequency power source. Sc target is sputtered by using a direct current power source for 30 minutes, and the obtained $Sc_5Sb_{38}Te_{57}$ thin film has a thickness of 180 nm.

FIG. 1 shows a variation curve of the $Sc_{100-x-y-z}Ge_xSb_yTe_z$ thin film resistance varied with the temperature. The heating rate used in FIG. 1 is 20° C./min. The $Sb_2Te_3$ has poor amorphous thermal stability, and presents polycrystalline morphology when it is deposited at room temperature. When $Sb_2Te_3$ is doped with Sc, a small amount of Sc element can increase the deposition resistance of $Sb_2Te_3$, which increases the ratio of high and low resistance states and increases the space for noise-tolerant of the storage space. Moreover, when being deposited at room temperature, Sc—Sb—Te shows an amorphous state, and the crystallization temperature reaches 235° C. High crystallization temperature is conducive to improve the stability of the amorphous state.

FIG. 2 shows a relationship between the data retention times for the Sc5Sb38Te57 film based on the Arrhenius equation and corresponding temperature. Retentivity is an important property for phase change material, and is the concentrated reflection of phase change stability. As can be seen from the figure, the $Sc_5Sb_{38}Te_{57}$ thin film can remain amorphous state at room temperature, and a ten-year data retention temperature thereof is 156° C.

FIG. 3 shows the voltage-resistance curve of a phase change device cell based on the $Sc_5Sb_{38}Te_{57}$ film, wherein the voltage pulse used for the test is 10 ns. It can be seen from FIG. 3 that under the effect of 10 ns wide pulse, the material can still achieve the transformation between high and low resistance values, which shows a rapid phase change characteristic of the material.

The deformable material for a phase change memory according to the present invention has an erasing operation time of picoseconds scale, has the ability of changing phase repeatedly, and has a cycle index of not less than $10^7$.

Embodiment 2

The technical solution used in this embodiment are basically the same as that in embodiment 1, except that the $Sb_2Te_3$ alloy target in embodiment one is changed to a $Sb_2Te$ alloy target. The remaining steps are exactly the same as embodiment one. The electrical properties of the obtained device also achieve similar effects.

Embodiment 3

This embodiment provides a $Sc_{100-x-y-z}Ge_xSb_yTe_z$ phase change material system for a phase change memory, wherein the phase change material system is a system for constructing a pseudo-binary phase change material system of $Sc_2Te_3$—$Sb_2Te_3$, the chemical formula thereof is $Sc_{100-x-y-z}Ge_xSb_yTe$, wherein x=0, 0<y≤80.

Driven by electricity, laser pulse or electron beam, the phase of the phase change material can be transformed reversibly to realize a function of data storage.

Specifically, in this embodiment, the $Sc_{100-x-y-z}Ge_xSb_yTe_z$ phase change material has a chemical formula of $Sc_{20}Sb_{20}Te_{60}$. A $Sc_{20}Sb_{20}Te_{60}$ thin film is obtained by co-sputtering a Sc simple substance target, a Sb simple substance target and a Te simple substance target. Different thickness of the material can be obtained by controlling the sputtering time. In this embodiment, the sputtering is carried out in an atmosphere of 99.999% argon. The Sc target is sputtered by using a direct current power source, the Sb target is sputtered by using a radio frequency power source, and the Te target is sputtered by using a radio frequency power source, such that a $Sc_{20}Sb_{20}Te_{60}$ thin film having a certain thickness can be obtained.

By testing the changing curve of the thin film resistance varied with temperature, it can be concluded that both the crystallization temperature and the ten-year data retentivity of $Sc_{20}Sb_{20}Te_{60}$ are better than that of $Ge_2Sb_2Te_5$.

By testing the voltage-resistance relation curve of the phase change device cell based on the $Sc_{20}Sb_{20}Te_{60}$ thin film, it is found that the material still can achieve the transformation between the high and low resistance under the action of lower pulse, which shows the rapid phase change characteristic of the material.

Embodiment 4

The technical solution used in present embodiment are basically the same as that in embodiment 3, except that the co-sputtering method of three targets, i.e., the Sc simple substance target, the Sb simple substance target and the Te simple substance target, in embodiment 4 is changed into a co-sputtering method of two targets, i.e., the $Sb_2Te_3$ alloy target and the $Sc_2Te_3$ alloy, wherein $Sb_2Te_3$ alloy target uses a radio-frequency power source, the $Sc_2Te_3$ alloy target uses a radio-frequency power source, and the remaining steps are exactly the same as embodiment 3. The electrical properties of the obtained device also achieve similar effects.

Embodiment 5

This embodiment provides a $Sc_{100-x-y-z}Ge_xSb_yTe_z$ phase change material system for a phase change memory, wherein the phase change material system is a system for constructing a pseudo-binary phase change material system of $Sc_2Te_3$—GeTe, and the chemical formula thereof is $Sc_{100-x-y-z}Ge_xSb_yTe_z$, wherein 0<x≤50, y=0.

Driven by electricity, laser pulse or electron beam, the phase of the phase change material can be transformed reversibly to realize a function of data storage.

Specifically, in this embodiment, the $Sc_{100-x-y-z}Ge_xSb_yTe_z$ phase change material has a chemical formula of $Sc_{22}Ge_{22}Te_{56}$. A $Sc_{22}Ge_{22}Te_{56}$ thin film is obtained by co-sputtering a Sc simple substance target, a Ge simple substance target and a Te simple substance target. Different thickness of the material can be obtained by controlling the sputtering time. In this embodiment, the sputtering is carried out in an atmosphere of 99.999% argon, the Sc target is sputtered by using a direct-current power source, the Ge target is sputtered by using a radio-frequency power source, and the Te target is sputtered by using a radio-frequency power source, such that a $Sc_{22}Ge_{22}Te_{56}$ thin film having a certain thickness can be obtained.

By testing the changing curve of the thin film resistance varied with temperature, it can be concluded that both the crystallization temperature and the ten-year data retentivity of $Sc_{22}Ge_{22}Te_{56}$ are better than that of $Ge_2Sb_2Te_5$.

By testing the voltage-resistance relation curve of the phase change device cell based on the $Sc_{22}Ge_{22}Te_{56}$ thin film, it is found that the material can still achieve the transformation between the high and low resistance under the action of lower pulse, which shows the rapid phase change characteristic of the material.

Embodiment 6

This embodiment provides a $Sc_{100-x-y-z}Ge_xSb_yTe_z$ phase change material system for a phase change memory, wherein the phase change material system is a system for constructing a pseudo-binary phase change material system of $Sc_2Te_3$—$Ge_2Sb_2Te_5$, and the chemical formula thereof is $Sc_{100-x-y-z}Ge_xSb_yTe_z$, wherein 0<x≤50, 0<y≤80.

Driven by electricity, laser pulse or electron beam, the phase of the phase change material can be transformed reversibly to realize a function of data storage.

Specifically, in this embodiment, the $Sc_{100-x-y-z}Ge_xSb_yTe_z$ phase change material has a chemical formula of $Sc_{14}Ge_{14}Sb_{14}Te_{58}$. A $Sc_{14}Ge_{14}Sb_{14}Te_{58}$ thin film is obtained by co-sputtering a $Sc_2Te_3$ alloy target and a $Ge_2Sb_2Te_5$ alloy target. Different thickness of the material can be obtained by controlling sputtering time. In this embodiment, the sputtering is carried out in an atmosphere of 99.999% argon. The $Sc_2Te_3$ target is sputtered by using a radio-frequency power source, and the $Ge_2Sb_2Te_5$ target is sputtered by using a radio-frequency power source, such that a $Sc_{14}Ge_{14}Sb_{14}Te_{58}$ thin film having a certain thickness can be obtained.

By testing the changing curve of the thin film resistance varied with temperature, it can be concluded that both the crystallization temperature and the ten-year data retentivity of $Sc_{14}Ge_{14}Sb_{14}Te_{58}$ are better than that of $Ge_2Sb_2Te_5$.

By testing the voltage-resistance relation curve of the phase change device cell based on the $Sc_{14}Ge_{14}Sb_{14}Te_{58}$ thin film, it is found that the material can still achieve the transformation between the high and low resistance under the action of lower pulse, which shows the rapid phase change characteristic of the material.

Embodiment 7

The technical solutions used in this embodiment are basically the same as that in embodiment 5, except that the co-sputtering method of two targets, i.e., the $Sc_2Te_3$ alloy target and $Ge_2Sb_2Te_5$ alloy target, in embodiment five is changed into a co-sputtering method of four targets, i.e., the Sc simple substance target and the Ge simple substance target as well as the Sb simple substance target and the Te simple substance target. The remaining steps are exactly the same as embodiment 5. The electrical properties of the obtained device also achieve similar effects.

Embodiment 8

This embodiment provides a $Sc_{100-x-y-z}Ge_xSb_yTe_z$ phase change material system for a phase change memory, wherein the phase change material system is a system for constructing a phase change material system of Sc—Te, and the chemical formula thereof is $Sc_{100-x-y-z}Ge_xSb_yTe_z$, wherein x=y=0.

Driven by electricity, laser pulse or electron beam, the phase of the phase change material can be transformed reversibly to realize a function of data storage.

Specifically, in this embodiment, the $Sc_{100-x-y-z}Ge_xSb_yTe_z$ phase change material has a chemical formula of $Sc_{40}Te_{60}$. A $Sc_{40}Te_{60}$ thin film is obtained by co-sputtering a Sc simple substance target and a Te simple substance target. Different thickness of the material can be obtained by controlling the sputtering time. In this embodiment, the sputtering is carried out in an atmosphere of 99.999% argon. the Sc target is sputtered by using a direct-current power source, and the Te target is sputtered by using a radio-frequency power source, such that a $Sc_{40}Te_{60}$ thin film having a certain thickness can be obtained.

By testing the changing curve of the thin film resistance varied with temperature, it can be concluded that both the crystallization temperature and the ten-year data retentivity of $Sc_{40}Te_{60}$ are better than that of $Ge_2Sb_2Te_5$.

By testing the voltage-resistance relation curve of the phase change device cell based on the $Sc_{40}Te_{60}$ thin film, it is found that the material can still achieve the transformation between the high and low resistance under the action of lower pulse, which shows the rapid phase change characteristic of the material.

Given the above, the present invention provides a phase change material for a phase change memory. The phase change material for phase change memory has a chemical formula of $Sc_{100-x-y-z}Ge_xSb_yTe_z$, wherein 0≤x≤60, 0≤y≤90, 0<z≤65, 0<100-x-y-z<100. The phase change material for a phase change memory can be obtained by using method such as magnetron sputtering, chemical vapor deposition, atomic layer deposition, pulsed laser deposition, electron beam evaporation or electroplating. The phase change material for a phase change memory according to the present invention is capable of repeatedly changing phases. The $Sc_{100-x-y-z}Ge_xSb_yTe_z$ has two different resistance value states, i.e., a high resistance state and a low resistance state, and a reversible transformation between the high resistance state and the low resistance state can be achieved by being applied a pulse electrical signal thereto, which satisfies basic requirements of a storage material for the phase change memory. The phase change material for a phase change memory according to the present invention is a novel storage material, and the thermal stability, the phase change speed and the fatigue-circulation performance of the material are therefore improved. A pulse voltage or a pulse laser can be used to drive the phase change material to be transformed reversibly among different structure states, and the performance of the phase change material is transformed reversibly at the same time, such that information storage of the phase change memory is achieved.

The above-mentioned embodiments are just used for exemplarily describing the principle and the effect of the present invention instead of limiting the present invention. One skilled in the art may make modifications or variations to the above-mentioned embodiments without departing from the spirit and scope of the present invention. Therefore, all equivalent modifications or variations made by one skilled in the art without departing from the spirit and technical concept disclosed by the present invention shall be also covered by the claims of the present invention.

What is claimed is:

1. A phase change material for a phase change memory, characterized in that the phase change material for a phase change memory has a chemical formula of $Sc_{100-x-y-z}Ge_xSb_yTe_z$, wherein x=0, 0<y≤80, 0<z≤65, 0<100-x-y-z<100.

2. The phase change material for a phase change memory according to claim 1, characterized in that: the phase change material for the phase change memory comprises a high resistance state and a low resistance state; the high resistance state corresponds to an amorphous state of the phase change material for the phase change memory; and the low resistance state corresponds to a full or a partial crystalline state of the phase change material for the phase change memory.

3. The phase change material for a phase change memory according to claim 1, characterized in that: driven by electricity, laser pulse or electron beam, the resistivity of the phase change material for the phase change memory can be transformed reversibly.

4. A method of preparing the phase change material for a phase change memory according to claim 1, characterized in that: the method of preparing the phase change material for the phase change memory comprises preparing the phase change material for the phase change memory by using magnetron sputtering, chemical vapor deposition, atomic layer deposition, pulsed laser deposition, electron beam evaporation or electroplating according to different proportions of Sc, Ge, Sb and Te in the chemical formula of $Sc_{100-x-y-z}Ge_xSb_yTe_z$.

5. The method of preparing the phase change material for a phase change memory according to claim 4, wherein the method of preparing the phase change material for the phase change memory comprises obtaining a needed phase change material for a phase change memory by co-sputtering Sc simple substance target and $Sb_2Te_3$ alloy target, Sc simple substance target and $Sb_2Te$ alloy target, or Sc simple substance target and Sb simple substance target as well as Te alloy target, wherein the Sc simple substance target uses a direct-current power source, and the $Sb_2Te_3$ alloy target, the $Sb_2Te$ alloy target, the Sb simple substance target and the Te simple substance target use radio-frequency power sources.

6. The method of preparing the phase change material for a phase change memory according to claim 4, characterized in that: the method of preparing the phase change material for the phase change memory comprises obtaining a needed phase change material for a phase change memory by co-sputtering $Sb_2Te_3$ alloy target and $Sc_2Te_3$ alloy target in argon atmosphere, wherein the $Sb_2Te_3$ alloy target uses a radio-frequency power source, and the $Sc_2Te_3$ alloy target uses a radio-frequency power source.

7. The method of preparing the phase change material for a phase change memory according to claim 4, characterized in that: the method of preparing the phase change material for the phase change memory comprises obtaining a needed phase change material for the phase change memory by co-sputtering $Sc_2Te_3$ alloy target and $Ge_2Sb_2Te_5$ alloy target, or Sc simple substance target and Ge simple substance target as well as Sb simple substance target and Te simple substance target in argon atmosphere, wherein the Sc simple substance target uses a direct-current power source, and the $Sc_2Te_3$ alloy Target, the $Ge_2Sb_2Te_5$ alloy target, the Ge simple substance target, the Sb simple substance target and the Te simple substance target use radio-frequency power sources.

8. The method of preparing the phase change material for a phase change memory according to claim 4, characterized in that: the method of preparing the phase change material for the phase change memory comprises obtaining a needed phase change material for the phase change memory by co-sputtering the Sc simple substance target, the Ge simple substance target and the Te simple substance target in argon atmosphere, wherein the Sc simple substance target uses a direct-current power source, the Ge simple substance target uses a radio-frequency power source, and the Te simple substance target uses a radio-frequency power source.

9. The method of preparing the phase change material for a phase change memory according to claim 4, characterized in that: the method of preparing the phase change material for the phase change memory comprises obtaining a needed phase change material for the phase change memory by co-sputtering the Sc simple substance target and the Te simple substance target in argon atmosphere, wherein the Sc simple substance target uses a direct-current power source, and the Te simple substance target uses a radio-frequency power source.

10. A phase change material for a phase change memory, characterized in that the phase change material for a phase change memory has a chemical formula of $Sc_{100-x-y-z}Ge_xSb_yTe_z$, wherein 0<x≤50, y=0, 0<z≤65, 0<100-x-y-z<100.

* * * * *